Aug. 17, 1965 L. V. TARDOSKEGYI 3,200,788

CENTRIFUGAL PRE-TINNING APPARATUS FOR PRINTED CIRCUIT BOARDS

Filed Oct. 30, 1963 3 Sheets-Sheet 1

INVENTOR
LOUIS V. TARDOSKEGYI

BY
Blum Moscovitz Friedman
Blum & Kaplan

INVENTOR
LOUIS V. TARDOSKEGYI
BY
Blum Moscovitz Friedman
Blum & Kaplan
ATTORNEYS.

Aug. 17, 1965 L. V. TARDOSKEGYI 3,200,788
CENTRIFUGAL PRE-TINNING APPARATUS FOR PRINTED CIRCUIT BOARDS
Filed Oct. 30, 1963 3 Sheets-Sheet 3

INVENTOR
LOUIS V. TARDOSKEGYI
BY
Blum Moscovitz Friedman Blum & Kaplan
ATTORNEYS.

United States Patent Office 3,200,788
Patented Aug. 17, 1965

3,200,788
CENTRIFUGAL PRE-TINNING APPARATUS FOR PRINTED CIRCUIT BOARDS

Louis V. Tardoskegyi, Montreal, Quebec, Canada, assignor to Electrovert Manufacturing Co. Ltd., Montreal, Quebec, Canada, a corporation of Canada Filed Oct. 30, 1963, Ser. No. 320,183
14 Claims. (Cl. 118—11)

This invention relates to the production of printed circuit boards, including the soldering of connections thereto, and more particularly to a novel centrifugal pre-tinning apparatus for coating the printed circuits with a protective layer of metal such as a tin-lead composition.

As is known to those skilled in the art, printed circuit boards are frequently made from a sheet of dielectric material, such as a plastic composition material, which has been coated with a layer of copper or other suitable electrically conductive material. The desired circuitry is then printed on the copper coating with etch-resistant ink. The thus printed board is then etched and all of the copper except that portion which has the circuit printed thereon is dissolved, leaving the board with the desired circuitry "printed" thereon in copper.

A characteristic of copper is that, after a certain time of "weathering," a corrosive layer forms on the exposed surface of the copper. In order to attain a good soldered joint between the printed circuitry and circuit components to be mounted on the circuit board, this corrosive layer must be removed from the printed copper circuitry. Such removal is a time-consuming and expensive proposition. Accordingly, it has been suggested that, immediately after the printing of the circuit board, the copper be "tinned" and thereby the surface of the copper be protected from the corrosion due to such "weathering."

An early solution to this problem was the suggestion of dipping the printed circuit board into a molten tinning bath, thereby covering the printed circuitry with a tinning layer. However, in most circuit boards there are holes punched or perforated through the boards whereby the terminals of various components, or other conductors, may be inserted through these holes and soldered to the circuitry on one or the other side of the board. The tinning operation effected by dipping frequently fills up these holes so that it has been necessary to remove the tinned deposits from the holes. One suggestion for doing this has been to drill out the holes after the board has been printed, but it will be appreciated that this procedure is expensive and time consuming, and requires skilled labor to properly drill out the holes.

Another suggestion has been to use an electrogalvanic process for pre-tinning the printed copper circuitry. This involved the galvanic deposition of a tinning layer, having a thickness of a few thousandths of an inch, onto the copper. However, as in all galvanic processes, the thus deposited tinning layer was characterized by porosity and therefore was not air-tight. Consequently, a tinning layer applied by an electrogalvanic process is not able to exclude completely the corrosive effects of the atmosphere.

It was then suggested that a dipping operation be used to tin the printed circuitry, with this operation being succeeded by fast slinging or shaking of the board to eject the solder out of the holes. When performed manually, this is a very expensive operation from the standpoint of labor costs, high solder loss, drossing, and lack of reliability due to human factors.

Another expedient which has been tried is roller pre-tinning. A brush roller is dipped into the molten solder and is rolled over the printed circuit board. This arrangement is expensive, unreliable, and results in uneven covering of the printed circuitry.

Still a further arrangement which has been tried at least experimentally is what might be termed "mechanical slinging." The printed circuit board is fastened to the shaft of an electric motor driven hand drill, and then dipped into the molten solder. The superfluous solder is shaken off and then the motor is started and rotates at approximately 1200–1500 r.p.m. This throws the solder out of most of the holes except those which are near to the center of rotation. This operation is likewise unsatisfactory due to blind holes at the center of rotation, and furthermore is extremely dangerous to the operator.

In accordance with the present invention, the difficulties encountered and the disadvantages of such prior art arrangements are avoided by a novel centrifugal pre-tinning operation in which the pre-tinning is effected within a vented enclosure and in an automatic cycle which involves, as human labor, only the loading of a fixture before the cycle is started and the unloading of a fixture after the cycle has been completed.

More particularly, in accordance with the present invention, a heated soldered pot is mounted within an upwardly extending enclosure and the temperature of the solder therein is maintained at a predetermined value so that the solder will remain molten. This enclosure includes a venting means, such as a fan, in its top or upper wall and has an openable door in its side wall arranged for positioning adjacent the work bench of an operator. Within the enclosure a frame or slide is mounted for vertical reciprocation upon a pair of upwardly extending guide rails. This slide oscillatably supports a horizontally extending shaft which lies in a plane substantially parallel to that of the rails. At about its center, this shaft supports the rotary motor whose axis extends perpendicularly to the shaft. The outer end of this rotary motor has secured to its drive shaft a jig or fixture arranged to have a printed circuit board mounted thereon.

Normally, the parts are biased to a position in which the jig or fixture projects through the openable door of the housing for access by the operator to mount a printed circuit board thereon. After mounting a printed circuit board on the jig or fixture, the operator presses a control button which initiates the cycle. Responsive to operation of the control button, the motor starts to rotate the jig or fixture at a relatively slow rate and, at the same time, the motor is swung downwardly so that its axis is substantially vertical, and the frame is lowered to dip the printed circuit board, which is being slowly rotated, into the molten solder bath. Such slow rotation within the molten solder bath is continued for a short interval to allow any collected flux fumes to be released and escape from beneath the plate, and also to assure thorough tinning of the printed circuitry on the rotating plate. The frame is then moved upwardly to withdraw the tinned plate from the molten solder bath, after which the rotational speed of the motor is simultaneously increased to a very high value so that the centrifugal force due to the high velocity spinning of the fixture and the plate thereon throws any molten tin out of the openings in the plate. Following this, rotation of the plate is stopped, the motor is swung to a position wherein its axis extends horizontally and the printed circuit board and the fixture upon which it is mounted project from the openable door so that the board may be removed from the fixture by an operator. The cycle is completely automatic from the pushing of the start control button until the positioning of the tin circuit plate in front of the operator. Thus, there is no danger to the operator and a thorough tinning arrangement is effected.

As a feature of the invention, the motor for rotating the fixture and the plate thereon is an air motor, and the shaft of the motor is hollow or tubular. By directing the exhaust from the air motor outwardly through this tubular shaft toward the plate mounted on the fixture, a blowing action is obtained which clears those holes, at or adjacent the center of rotation, of molten solder, thus assuring one-hundred percent clearing of all the holes in the printed circuit board.

For an understanding of the principles of the invention, reference is made to the following description of a typical embodiment thereof as illustrated in the accompanying drawings. In the drawings:

FIG. 1 is a vertical sectional view of the apparatus taken essentially on the line 1—1 of FIG. 2;

FIGS. 2 and 3 are vertical sectional views of the apparatus taken on the lines 2—2 and 3—3, respectively, of FIG. 1;

Figure 1:
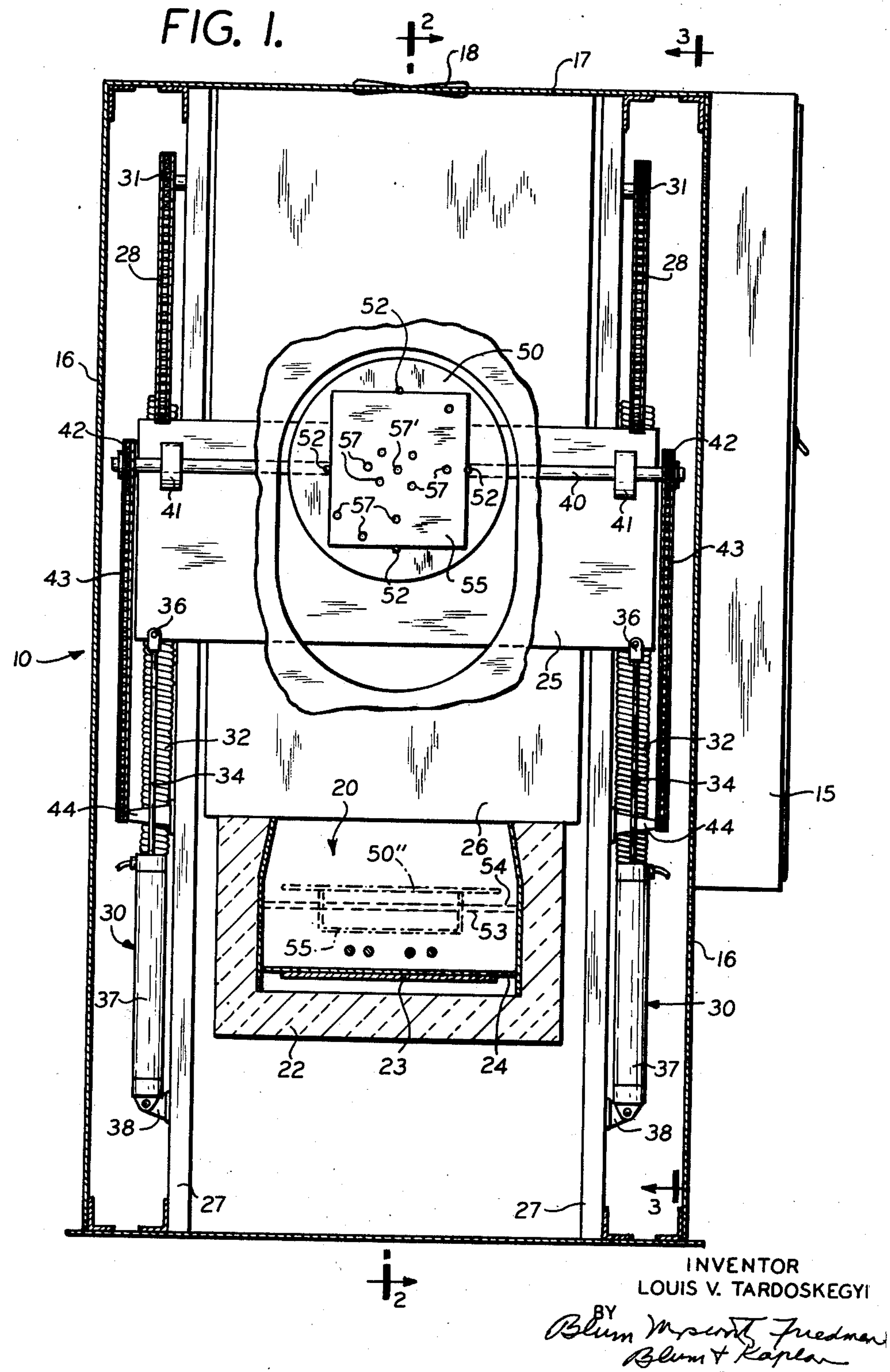
Figures 2, 3, 4:
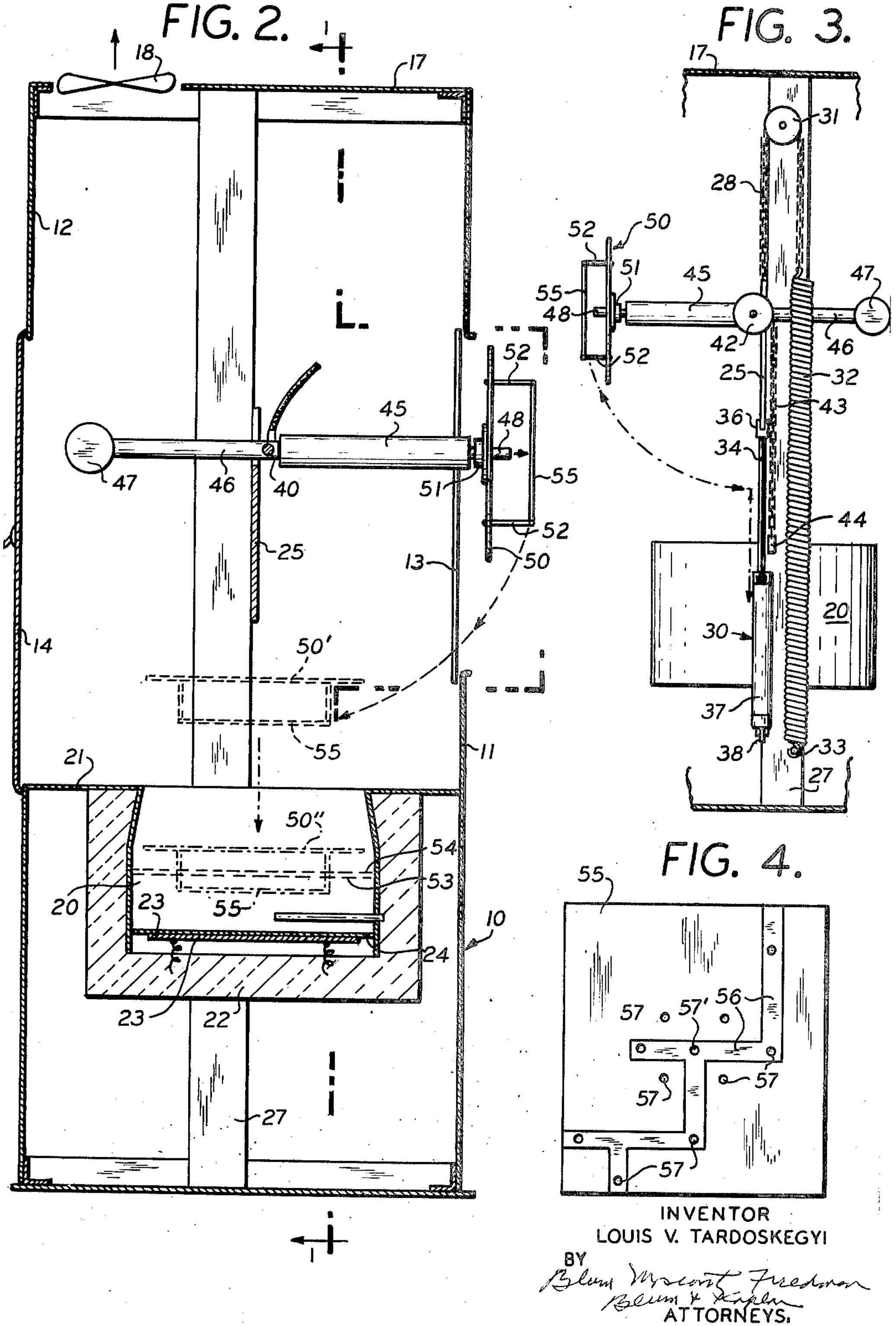
FIG. 4 is a plan view of a typical printed circuit board.

Referring to FIGS. 1, 2 and 3, the apparatus is contained within a metal housing 10 having a front wall 11 and a rear wall 12. Front wall 11 is provided with a sliding door 13 which is adjacent the operator and is for access to the work, and rear wall 12 is provided with a clean out door 14. A control box or cabinet 15 is mounted on a side wall 16 of housing 10, and a top wall 17 of the housing is formed with an opening in which there is an exhaust fan 18.

Within the lower portion of housing 10, a solder pot 20 is supported upon a horizontal partition 21 and is enclosed in heat insulating material 22. The solder in pot 20 is maintained molten by an electric heater 23 disposed in a recess in the heat insulation 22 beneath the bottom 24 of the solder pot. An enclosure 26 extends upwardly from the partition 21 and separates the working space from the mechanical equipment and the control equipment of the apparatus.

A pair of rails 27, which are preferably T-shape in cross section, extend vertically the full length of the housing 10 and serve as guides for a substantially flat frame or slide 25. A pair of chains 28 are connected to the upper edge of slide 25 and are trained over pulleys 31 adjacent the upper ends of rails 27. The other ends of chains 28 are connected to the upper ends of tension coil springs 32 whose lower ends are secured to columns 27 by means of anchors 33. By this arrangement, slide 25 is biased upwardly to its limit of movement in an upward direction.

Downward movement of slide 25 along rails 27 is effected by pneumatic actuators 30, each of which has a piston rod 34 connected to slide 25 by a clevis 36. The lower ends of the cylinders 37 of actuators 30 are pivotally connected to brackets 38 adjacent the lower ends of rails 27. When air is supplied to actuators 30, the pistons therein are moved downwardly in cylinders 37 drawing down piston rods 35 and thus lowering slide 25. Upwardly movement of slide 25 under the biasing influence of springs 32 is limited by engagement of the pistons of actuators 30 with the upper cylinder heads thereof.

There are a pair of bearings 41 one adjacent each side edge of slide 25, and bearings 41 rotatably support a shaft 40 which has sprockets 42 at each end thereof. Each sprocket 42 has the upper end of a chain 43 anchored thereto, and the lower end of each chain 43 is secured or anchored to a bracket 44 on a rail 27.

A rotary air motor 45 is secured to a rod 46 which is apertured to receive the shaft 40 and is anchored to the shaft. The left end of rod 46, as viewed in FIG. 2, carries a counterweight 47 for partially balancing the weight of air motor 45 and the parts carried thereby.

Air motor 45 has a tubular drive shaft 48 serving as a coaxially located exit nozzle for discharge or exhaust of the air from motor 45. A substantially circular jig or fixture 50 is provided with a collar 51 which is anchored onto the shaft 48 somewhat inwardly of the outer end thereof. While jig of fixture 48 is illustrated as circular, it should be understood that the contour of this jig or fixture need not be circular but may be square, rectangular, or any other desired configuration in accordance with, for example, the type of work to be supported thereon. The outer surface of fixture 50 carries locating clamps or pins 52 spaced at appropriate intervals therearound, and these clamping or fastening elements 52 are used to readily and easily secure and release a printed circuit board or the like, illustrated at 55, from the jig or fixture 50.

A typical circuit board 55, as it appears after the etching, is illustrated in FIG. 4 as having copper strips 56, forming parts of circuits, on a surface. At intervals along the strips 56, and at other locations outside the strips, the printed circuit board 55 is apertured, as at 57, for passage of conductors, component prongs or terminals, and the like, through the board from one surface to the other. It is these apertures 57 which, during a normal dip tinning operation, become filled with the solder and are plugged, so that the solder must be removed therefrom.

Figure 5:
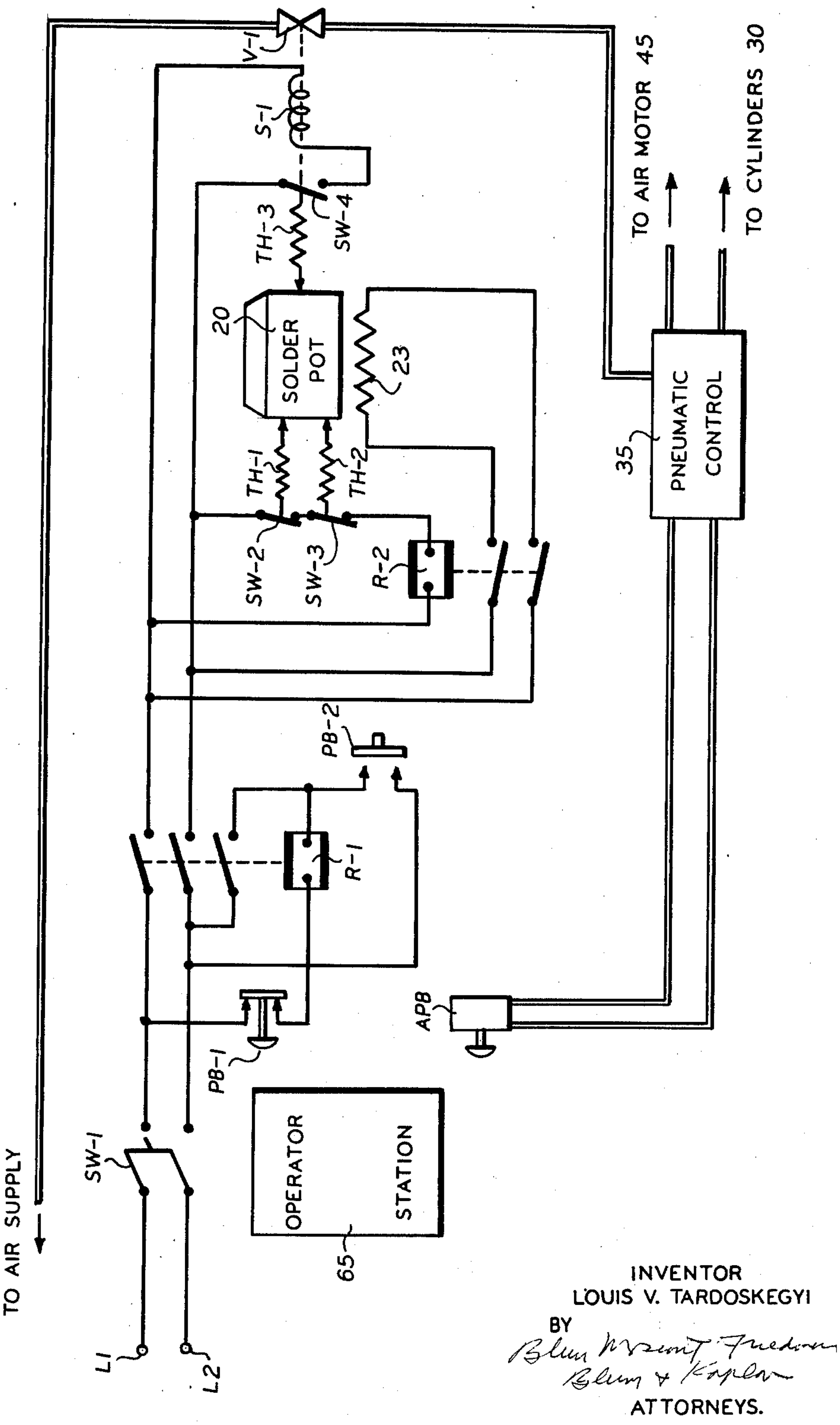
FIG. 5 is a schematic electro-pneumatic diagram of the apparatus illustrating the automatic cycle controls.

Before describing the operation of the present invention in detail, reference will be made to FIG. 5 which illustrates a schematic electro-pneumatic diagram of the control circuitry associated with the apparatus. Terminals L1 and L2 are connected to a suitable source of electric potential, and power is supplied to the system when a main switch SW–1 is closed. When the operator presses pushbutton PB–2, relay R–1 transfers to close the line and to close its own holding circuit, as illustrated. This picks up relay R–2, which transfers to close the energizing circuit for heater 23 for solder pot 20. Associated with solder pot 20 are three thermostats TH–1, TH–2 and TH–3. Thermostat TH–1 is a solder temperature control and thermostat TH–2 is an overheating control. When either thermostat TH–1 or TH–2 opens its associated switch, relay R–2 is transferred to its normal position opening the circuit to pot heater 23.

Thermostat TH–3 controls a normally open switch. When the solder is molten, thermostat TH–3 closes its switch to energize solenoid S–1. Solenoid S–1, when energized, opens valves V–1 which is located in an air line 60 leading from a suitable air supply to the pneumatic control 35. When air valve V–1 is open, supplying air to control 35, the system is ready for operation.

At this time, the fixture 50 occupies the position shown in FIGS. 1, 2 and 3 where it extends through the opened sliding doors 13. The operator may then load a printed circuit plate 55 onto fixture 50 by means of the quick releasable connections 52. The operator, at station 65, then operates the air-pushbutton APB which admits air from the line 60 to the controls in control box 35. Air is thus supplied to cylinders 30 and to motor 45. The air supplied to cylinders 30 draws down the slide 25, and the air supplied to motor 45 starts this motor to rotate the jig 50 at a relatively slow rate. The relation of the weight of motor 45, jig 50, and circuit board 55 with respect to counterweight 47 and its support arm 46 is such that the arrangement tends to swing counterclockwise as viewed in FIG. 3. As the air cylinders 30 draw down slide 25, the motor 45 and jig 50 tend to swing to the position shown in dotted lines in FIG. 2, wrapping chains 43 around sprockets 42. The downward movement is continued until jig 50 and the circuit board 55 occupy the position shown in FIGS. 1 and 2 wherein circuit board 55 is located below the level 53 of the solder in solder pot 20. A layer or film of oil is maintained on top of the molten solder as indicated at 54.

It should be further noted that the movement of motor 45 and jig 50 to the position wherein the jig is substantially horizontal, as indicated at 50' in FIG. 2, occurs before the circuit board 55 has been moved into the solder pot. During the remainder of the downward movement of slide 25 by operation of actuators 30, the chain 43 merely becomes slack. The third position of the jig 50 is illustrated at 50'', wherein board 55 has been passed through oil film 54 and is below the surface 53 of the molten solder. During all this time, the motor 45 is slowly rotating jig 50 and printed circuit board 55 mounted thereon.

After a predetermined time interval, set by the controls in box 35, the air is released from actuators 30 to an extent such as to allow slide 25 to move upwardly to a point where jig 50 occupies the position 50'. During this time, motor 45 is still slowly rotating jig 50. Solder is thus flung off, and no harm occurs to the operator as the doors 13 close automatically after the jig 50 is swung into the housing 10. At the position 50', all of the slack has been taken out of the chains 43.

Automatic controls in box 35 now supply air to motor 45 at a rate such that the motor spins jig 50 at a very high rate of speed to throw off the solder by centrifugal force. This clears all of the apertures 57 except those, such as the apertures 57', which are located just about on the axis of the motor 45. However, the exhaust air from motor 45 is discharged through tubular motor shaft 48 and this air, still under some pressure, blows through those apertures 57' which are located in the plate 55 at or adjacent the center of rotation of jig 50. This exhaust air blows any solder out of these holes.

After a predetermined time interval, again determined by controls in box 35, the air is completely released from actuators 30 and the air supplied to motor 45 is shut off. Under the influence of springs 32, slide 25 moves further upwardly and, during such upward movement, chains 43 are unwound from sprockets 42 thereby swinging motor 45 and jig 50 to the position shown in solid lines in FIGS. 2 and 3. At the same time, doors 13 are automatically slid open so that the operator may have access to jig 50 and pre-tinned circuit board 55. The operator may then remove circuit board 55, and position another circuit board on jig 50, after which the operation is repeated by again pressing air-pushbutton APB.

Should anything go wrong with the operation, such as a blockage of movement of slide 25 or a blockage of motor 45, the operator merely hits the emergency pushbutton PB–1, which may be a palm type of pushbutton. This opens the circuit to relay R–1 which transfers its contacts to cut off the electric current to relay R–2 and solenoid S–1. This immediately stops operation of the entire system, and the system may then be checked before the next operation is effected.

It will be noted that the apparatus is wholly automatic and that the human factor is eliminated except for unloading and loading the jig 50. It is possible to pre-tin approximately 200 circuit boards per hour using an unskilled operator, and the pre-tinning operation is completely reproducible by setting all the variables such as solder temperature, oil coverage, dipping time, slinging force, slinging time and air jet force exising from tubular shaft 48 of motor 45. The operation is completely safe because the whole operation occurs in a completely closed housing 10.

When the emergency stop pushbutton PB–1 is pressed, the electric current and the air supply are immediately shut off and jig 50 returns to the starting position automatically. The exhaust fan 18 is connected into the circuit in such a manner that it begins to operate as soon as the heating of the solder is initiated and continues to operate as long as relay R–1 is transferred responsive to operation of pushbutton PB–2. This fan exhausts completely all fumes and heat from the enclosure.

As explained above, during dipping of the printed circuit board into the solder pot, the board is spun slowly to avoid pockets of air or pockets of flux fumes. An important feature is the clearing of solder from the central or axially located apertures, such as 57', by use of the exhaust air jet from motor 45. The oil film 54 on top of the surface 53 of the molten solder prevents drossing of the solder and facilitates the pre-tinning operation.

While a specific embodiment of the invention has been shown and described in detail to illustrate the application of the principles of the invention, it will be understood that the invention may be embodied otherwise without departing from such principles.

What is claimed is:

1. Apparatus for pre-tinning printed circuit boards comprising, in combination, an enclosure having a work loading opening in a side wall thereof; a solder pot within the lower portion of said enclosure and containing molten solder; a jig arranged to have a printed circuit board mounted thereon; a shaft secured to said jig to extend substantially perpendicularly to the printed circuit board; motor means operable to rotate said shaft; supporting means mounting said shaft for swinging movement between a generally horizontal position and a vertical position in which said shaft is substantially centered with respect to said solder pot; and means operable to move said support means between a jig loading position, in which said shaft is horizontal and said jig is adjacent said work loading opening, a lower position in which said shaft is verticle and a printed circuit board on said jig is dipped into the molten solder, and an intermediate position in which said shaft is vertical and said printed circuit board is above said solder pot; said motor means, when said printed circuit board is dipped in said molten solder, rotating said shaft at a relatively low speed and, when said shaft is raised to said intermediate position, rotating said shaft at a high angular velocity to fling molten solder from openings in said circuit board; said motor means being ineffective to rotate said shaft when said latter is in the horizontal position.

2. Apparatus for pretinning printed circuit boards, as claimed in claim 1, including means operable to discharge air under pressure toward apertures in said printed circuit board adjacent the axis of rotation of said shaft during rotation of said shaft by said motor means.

3. Apparatus for pre-tinning printed circuit boards, as claimed in claim 1, including means biasing said support means to the work loading position; and emergency "stop" means effective, upon actuation, to activate said biasing means and to deenergize said motor means.

4. Apparatus for pre-tinning printed circuit boards, comprising, in combination, a generally upright enclosure having a work loading opening in a side wall thereof; guide rail means extending upwardly of said enclosure; a solder pot within the lower portion of said enclosure, centered with respect to said guide rail means, and containing molten solder; a slide mounted for movement along said guide rail means; a shaft mounted on said slide for rotation, and for swinging movement between a generally horizontal position and a vertical position in which said shaft is substantially centered relative to said solder pot; motor means operable to rotate said shaft; a jig secured to said shaft adjacent the free end thereof for rotation therewith, and arranged to have a printed circuit board mounted thereon; means operable to move said slide along said guide rail means between an upper work loading position, a lower dipping position in which a printed circuit board mounted on said jig is dipped into the molten solder, and an intermediate position between said upper and lower positions; and means operable, responsive to movement of said slide from said intermediate position to said upper position to swing said shaft from a vertical position to a horizontal position and, upon movement of said slide from said upper position to said intermediate position to swing said shaft from its horizontal position to its vertical position; said jig, in the upper position of said slide, being positioned to extend through said work loading opening; said motor means, upon movement of said slide to said lower position, rotating said shaft at a relatively low rate to pre-tin the printed circuitry on the printed circuit board mounted on said jig and, upon movement of said slide upwardly to said intermediate position, rotating said shaft at a high angular velocity to discharge molten solder, from apertures in the printed circuit board, by centrifugal force; said motor means, upon movement of said slide to said upper position, being ineffective to rotate said shaft.

5. Apparatus for pre-tinning printed circuit boards, as claimed in claim 4, in which said shaft is a tubular shaft having its free end extending through a central opening in said jig; and means operable to discharge air under pressure through the free end of said shaft to blow molten solder from those apertures in a printed circuit board located adjacent the axis of rotation of said shaft.

6. Apparatus for pre-tinning printed circuit boards, as claimed in claim 5, in which said motor means comprises an air motor swingably mounted on said slide and having its exhaust discharging outwardly through said tubular shaft.

7. Apparatus for pre-tinning printed circuit boards, as claimed in claim 4, including means continuously biasing said slide toward its upper position.

8. Apparatus for pre-tinning printed circuit boards, as claimed in claim 4, including fan means continuously exhausting the interior of said enclosure to atmosphere.

9. Apparatus for pre-tinning printed circuit boards, as claimed in claim 4, including means maintaining a film of oil on the surface of the molten solder in said solder pot.

10. Apparatus for pre-tinning printed circuit boards, as claimed in claim 4, in which said shaft is secured to a pivot extending horizontally of said slide and oscillatably mounted thereon, said pivot being angularly movable with swinging movement of said shaft; a pulley secured to said pivot; said means operable to swing said shaft comprising a chain secured at one end to said pulley and at its other end to a point fixed with respect to said enclosure, and the length and disposition of said chain being such that, as said slide is moved to its upper position, said chain unwinds from said pulley for swinging of said shaft to its horizontal position; and pulley, as said slide moves toward its lower position, rotating due to the weight of said shaft, to wind said chain thereabout until said shaft assumes a vertical position.

11. Apparatus for pre-tinning printed circuit boards, as claimed in claim 7, in which said means operable to move said slide comprises air cylinder and piston means connected between said guide rail means and to said slide.

12. Apparatus for pre-tinning printed circuit boards, as claimed in claim 11, in which said motor means comprises an air motor; said shaft being a tubular shaft and the exhaust of said air motor being discharged through said tubular shaft to blow molten solder from apertures in a printed circuit board and adjacent the axis of rotation of said shaft.

13. Apparatus for pre-tinning printed circuit boards, as claimed in claim 12, in which said air motor is secured to a pivot shaft extending transversely of said slide and mounted oscillatably on said slide; and a counterbalance extending from said pivot shaft in a direction opposite to that of said air motor.

14. Apparatus for pre-tinning printed circuit boards, as claimed in claim 12, including a solenoid valve controlling flow of air to said motor and said cylinders; a relay; an energizing circuit for said solenoid valve including normally open contacts of said relay; an energizing circuit for said relay; and a normally closed pushbutton switch in said relay energizing circuit; whereby, upon operation of said pushbutton switch, said relay is deenergized to open the energizing circuit for said solenoid valve to close said solenoid valve to interrupt the air supplied to said air motor and to said cylinders.

No references cited.

WHITMORE A. WILTZ, *Primary Examiner.*